(12) United States Patent
Dawson et al.

(10) Patent No.: US 10,283,939 B2
(45) Date of Patent: May 7, 2019

(54) LOW COST OPTICAL PUMP LASER PACKAGE

(71) Applicant: nLIGHT, Inc., Vancouver, WA (US)

(72) Inventors: David C. Dawson, Brush Prairie, WA (US); Wolfram Urbanek, Camas, WA (US); David Martin Hemenway, Beaverton, OR (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 15/849,057

(22) Filed: Dec. 20, 2017

(65) Prior Publication Data

US 2018/0183214 A1  Jun. 28, 2018

Related U.S. Application Data

(60) Provisional application No. 62/438,961, filed on Dec. 23, 2016.

(51) Int. Cl.
*H01S 5/40* (2006.01)
*H01S 5/024* (2006.01)
(Continued)

(52) U.S. Cl.
CPC ............ *H01S 5/4075* (2013.01); *H01S 5/022* (2013.01); *H01S 5/0226* (2013.01);
(Continued)

(58) Field of Classification Search
CPC .... H01S 5/4075; H01S 5/022; H01S 5/02292; H01S 5/02284; H01S 5/0226;
(Continued)

(56) References Cited

U.S. PATENT DOCUMENTS 3,622,906 A  11/1971 Nyul
3,827,059 A  7/1974 Rambauske
(Continued)

FOREIGN PATENT DOCUMENTS

CN  1829015  9/2006
CN  1975507  6/2007
(Continued)

OTHER PUBLICATIONS

International Search Report and Written Opinion for related International Application No. PCT/US2017/023067, 12 pages, dated Jun. 27, 2017.
(Continued)

*Primary Examiner* — Dung Nguyen
(74) *Attorney, Agent, or Firm* — Klarquist Sparkman, LLP

(57) ABSTRACT

Laser diode packages include a rigid thermally conductive base member that includes a base member surface situated to support at least one laser diode assembly, at least one electrode standoff secured to the base member surface that has at least one electrical lead having a first end and a second end with the first end secured to a lead surface of the electrode standoff, and a lid member that includes a lid portion and a plurality of side portions extending from the lid portion and situated to be secured to the base member so as to define sides of the laser diode package, wherein at least one of the side portions includes a lead aperture situated to receive the second end of the secured electrical lead that is insertable through the lead aperture so that the lid member extends over the base member to enclose the laser diode package.

25 Claims, 7 Drawing Sheets

(51) Int. Cl.
*H01S 5/022* (2006.01)
*H01S 5/042* (2006.01)
*H01S 3/0941* (2006.01)
*H01S 3/094* (2006.01)

(52) U.S. Cl.
CPC ...... *H01S 5/02284* (2013.01); *H01S 5/02292* (2013.01); *H01S 5/02469* (2013.01); *H01S 5/0425* (2013.01); *H01S 3/0941* (2013.01); *H01S 3/094003* (2013.01)

(58) Field of Classification Search
CPC ............... H01S 5/0425; H01S 5/02469; H01S 3/094003; H01S 3/0941
See application file for complete search history.

(56) References Cited

U.S. PATENT DOCUMENTS

| | | | |
|---|---|---|---|
| 4,151,582 A | 4/1979 | Grunberger | |
| 4,550,333 A | 10/1985 | Ridder et al. | |
| 4,609,262 A | 9/1986 | Fujikawa et al. | |
| 4,689,482 A | 8/1987 | Horikawa et al. | |
| 4,716,568 A | 12/1987 | Scifres et al. | |
| 4,719,631 A | 1/1988 | Conaway | |
| 4,828,357 A | 5/1989 | Arata et al. | |
| 5,048,911 A | 9/1991 | Sang et al. | |
| 5,077,750 A | 12/1991 | Pocholle et al. | |
| 5,105,430 A | 4/1992 | Mundinger et al. | |
| 5,168,401 A | 12/1992 | Endriz | |
| 5,251,060 A | 10/1993 | Uenishi et al. | |
| 5,305,344 A | 4/1994 | Patel | |
| 5,319,528 A | 6/1994 | Raven | |
| 5,515,391 A | 5/1996 | Endriz | |
| 5,610,930 A | 3/1997 | Macomber et al. | |
| 5,668,822 A | 9/1997 | Tada | |
| 5,764,675 A | 6/1998 | Juhala | |
| 5,825,551 A | 10/1998 | Clarkson et al. | |
| 5,828,683 A | 10/1998 | Freitas | |
| 5,887,096 A | 3/1999 | Du et al. | |
| 5,898,211 A | 4/1999 | Marshall et al. | |
| 5,909,458 A | 6/1999 | Freitas et al. | |
| 5,986,794 A | 11/1999 | Krause et al. | |
| 5,987,043 A | 11/1999 | Brown et al. | |
| 6,028,722 A | 2/2000 | Lang | |
| 6,041,072 A | 3/2000 | Ventrudo et al. | |
| 6,044,096 A | 3/2000 | Wolak et al. | |
| 6,057,871 A | 5/2000 | Peterson | |
| 6,075,912 A | 6/2000 | Goodman | |
| 6,115,185 A | 9/2000 | Du et al. | |
| 6,124,973 A | 9/2000 | Du et al. | |
| 6,212,310 B1 | 4/2001 | Waarts et al. | |
| 6,229,831 B1 | 5/2001 | Nightingale et al. | |
| 6,240,116 B1 | 5/2001 | Lang et al. | |
| 6,266,359 B1 | 7/2001 | Taheri et al. | |
| 6,324,320 B1 | 11/2001 | Goodman | |
| 6,327,285 B1 | 12/2001 | Wang | |
| 6,377,410 B1 | 4/2002 | Wang et al. | |
| 6,440,778 B1 * | 8/2002 | Okada ............... H01L 27/14618 257/432 |
| 6,462,883 B1 | 10/2002 | Wang et al. | |
| 6,552,853 B2 | 4/2003 | Goodman | |
| 6,556,352 B2 | 4/2003 | Wang et al. | |
| 6,636,538 B1 | 10/2003 | Stephens | |
| 6,673,699 B2 | 1/2004 | Hubbard et al. | |
| 6,680,800 B1 | 1/2004 | Schreiber et al. | |
| 6,683,727 B1 | 1/2004 | Goring et al. | |
| 6,700,709 B1 | 3/2004 | Fermann | |
| 6,710,926 B2 | 3/2004 | Beach et al. | |
| 6,765,725 B1 | 7/2004 | Fermann et al. | |
| 6,778,732 B1 | 8/2004 | Fermann | |
| 6,898,222 B2 | 5/2005 | Hennig et al. | |
| 6,903,863 B1 | 6/2005 | Carniel et al. | |
| 6,975,659 B2 | 12/2005 | Nagano et al. | |
| 7,420,996 B2 | 9/2008 | Schulte et al. | |
| 7,436,868 B2 | 10/2008 | Schulte et al. | |
| 7,443,895 B2 | 10/2008 | Schulte et al. | |
| 7,537,395 B2 | 5/2009 | Savage-Leuchs | |
| 7,586,963 B2 | 9/2009 | Schulte et al. | |
| 7,733,932 B2 | 6/2010 | Faybishenko | |
| 7,751,458 B2 | 7/2010 | Regaard et al. | |
| 7,764,723 B2 | 7/2010 | Ovtchinnikov et al. | |
| 7,830,608 B2 | 11/2010 | Hu | |
| 7,848,372 B2 | 12/2010 | Schulte et al. | |
| 7,947,517 B2 | 5/2011 | Hisa | |
| 8,000,360 B2 | 8/2011 | Faybishenko | |
| 8,066,389 B2 | 11/2011 | Silverstein et al. | |
| 8,126,028 B2 | 2/2012 | Clifford, Jr. | |
| 8,339,598 B2 | 12/2012 | Ban et al. | |
| 8,427,749 B2 | 4/2013 | Du et al. | |
| 8,432,945 B2 | 4/2013 | Faybishenko | |
| 8,437,086 B2 | 5/2013 | Du et al. | |
| 8,488,245 B1 | 7/2013 | Chann | |
| 8,508,729 B2 | 8/2013 | Ban et al. | |
| 8,553,221 B2 | 10/2013 | Volodin et al. | |
| 8,599,485 B1 | 12/2013 | Cobb | |
| 8,654,326 B2 | 2/2014 | Volodin et al. | |
| 8,711,894 B2 | 4/2014 | Chuyanov et al. | |
| 8,830,587 B2 | 9/2014 | Bhatia et al. | |
| 8,842,369 B2 | 9/2014 | Li | |
| 8,861,082 B2 | 10/2014 | Cobb | |
| 8,873,134 B2 | 10/2014 | Price et al. | |
| 8,891,579 B1 | 11/2014 | Price et al. | |
| 8,942,521 B2 | 1/2015 | Song et al. | |
| 9,005,262 B2 | 4/2015 | Liu et al. | |
| 9,373,932 B2 | 6/2016 | Hayamizu et al. | |
| 9,413,136 B1 | 8/2016 | Vethake et al. | |
| 9,455,552 B1 | 9/2016 | Price et al. | |
| 9,705,289 B2 | 7/2017 | Kanskar et al. | |
| 9,720,145 B2 | 8/2017 | Kanskar | |
| 2004/0114027 A1 | 6/2004 | Frith | |
| 2004/0252388 A1 | 12/2004 | Yamanaka et al. | |
| 2006/0165144 A1 | 7/2006 | Mikhailov et al. | |
| 2006/0280209 A1 | 12/2006 | Treusch | |
| 2007/0047401 A1 | 3/2007 | Sun | |
| 2007/0116071 A1 | 5/2007 | Schulte et al. | |
| 2007/0116077 A1 | 5/2007 | Farmer et al. | |
| 2007/0217467 A1 | 9/2007 | DeFranza et al. | |
| 2007/0217468 A1 | 9/2007 | DeFranza et al. | |
| 2007/0217469 A1 | 9/2007 | DeFranza et al. | |
| 2007/0217470 A1 | 9/2007 | DeFranza et al. | |
| 2007/0217471 A1 | 9/2007 | DeFranza et al. | |
| 2007/0236781 A1 | 10/2007 | Fidric | |
| 2007/0268572 A1 | 11/2007 | Hu | |
| 2007/0268945 A1 | 11/2007 | Schulte et al. | |
| 2007/0268946 A1 | 11/2007 | Schulte et al. | |
| 2007/0268947 A1 | 11/2007 | Schulte et al. | |
| 2008/0019010 A1 | 1/2008 | Govorkov et al. | |
| 2009/0323752 A1 | 12/2009 | Chuyanov et al. | |
| 2010/0158060 A1 | 6/2010 | Faybishenko | |
| 2010/0226405 A1 | 9/2010 | Chuyanov et al. | |
| 2013/0148684 A1 | 6/2013 | Guo et al. | |
| 2013/0162956 A1 | 6/2013 | Okuda | |
| 2013/0194801 A1 | 8/2013 | Wolf et al. | |
| 2014/0036375 A1 | 2/2014 | Chann et al. | |
| 2014/0300971 A1 | 10/2014 | Wolak et al. | |
| 2015/0055667 A1 * | 2/2015 | Horn ............... H01S 5/02208 372/36 |
| 2015/0131692 A1 | 5/2015 | Hayamizu et al. | |
| 2015/0280404 A1 | 10/2015 | Kasai et al. | |
| 2015/0295386 A1 | 10/2015 | Hemenway et al. | |
| 2015/0349481 A1 | 12/2015 | Kliner | |
| 2016/0181764 A1 | 6/2016 | Kanskar et al. | |
| 2017/0271837 A1 | 9/2017 | Hemenway et al. | |

FOREIGN PATENT DOCUMENTS

| | | |
|---|---|---|
| CN | 101141051 | 3/2008 |
| CN | 101144909 | 3/2008 |
| CN | 201113224 | 9/2008 |
| CN | 201515142 | 6/2010 |
| CN | 102074896 | 5/2011 |
| CN | 102437509 | 5/2012 |
| CN | 202548385 | 11/2012 |
| CN | 202720390 | 2/2013 |

(56) References Cited

FOREIGN PATENT DOCUMENTS

| CN | 203071399 | 7/2013 |
|----|-----------|--------|
| CN | 103368066 | 10/2013 |
| CN | 103401136 | 11/2013 |
| EP | 0721113 | 7/1996 |
| RU | 2010143026 | 4/2012 |
| WO | WO 2005059626 | 6/2005 |

OTHER PUBLICATIONS

Edwin, "Stripe Stacker for Use with Laser Diode Bars," Optics Letters, 20:222-224 (Jan. 15, 1995).

International Search Report and Written Opinion for International Application No. PCT/US2015/019288, dated Jun. 10, 2015.

International Search Report and Written Opinion from International Application No. PCT/US2017/018210, dated May 8, 2017, 12 pages.

Lens Cell, Crossed Cylinders, Pearl Drawing, 1 page (Feb. 22, 2007).

\* cited by examiner

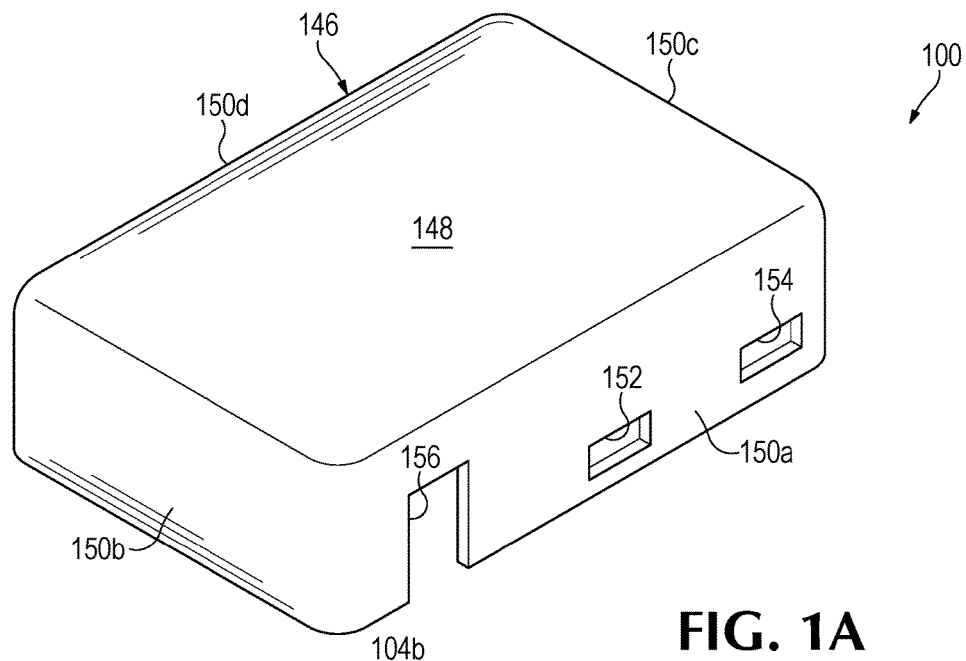
FIG. 1A
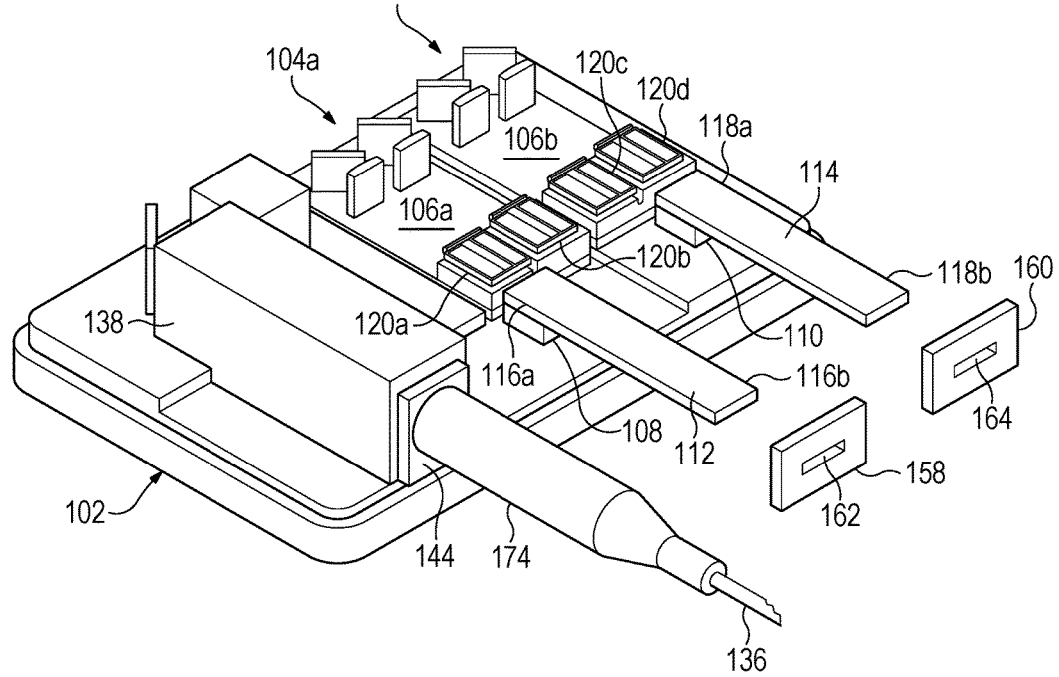

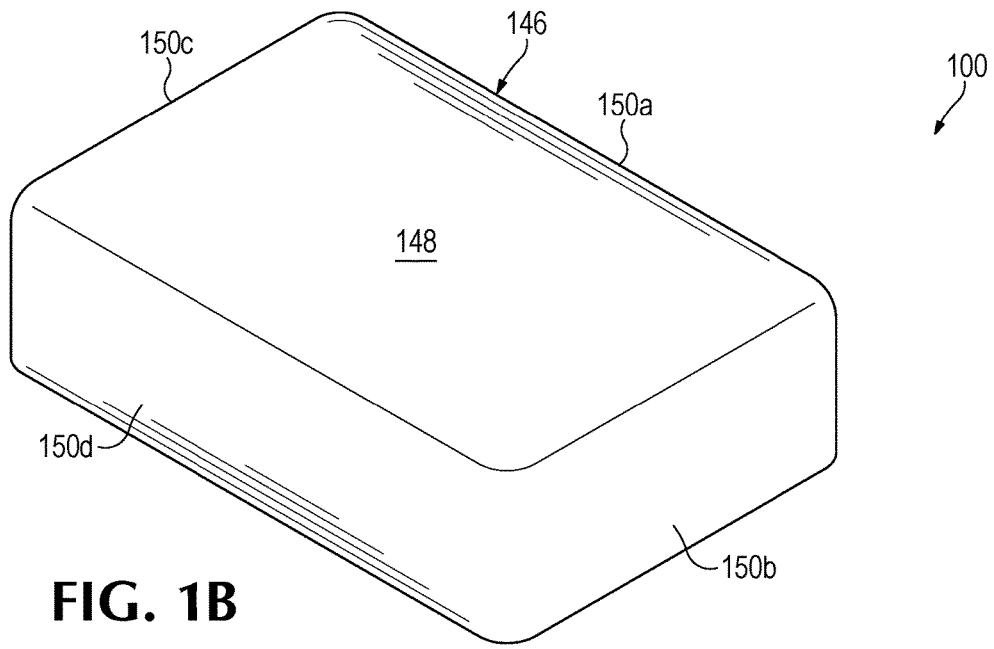
FIG. 1B
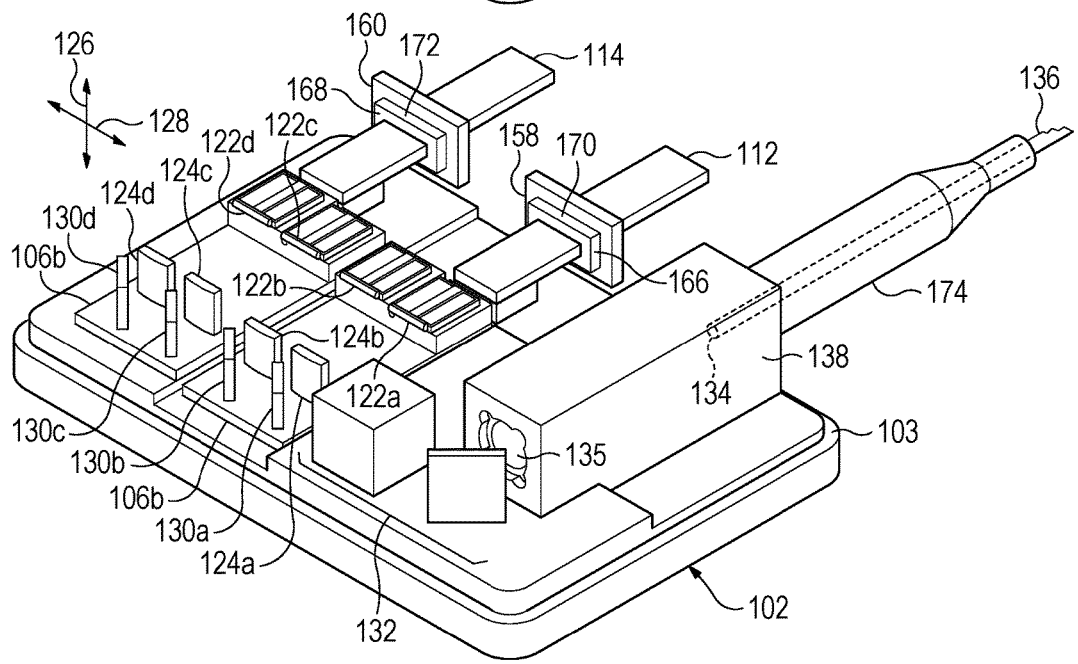

LOW COST OPTICAL PUMP LASER PACKAGE

CROSS REFERENCE TO RELATED APPLICATION

This application claims the benefit of U.S. Provisional Patent Application No. 62/438,961, filed Dec. 23, 2016, which is incorporated by reference herein in their entirety.

FIELD

The disclosure pertains to laser diode packages.

BACKGROUND

Laser diode packages are typically situated to generate substantial amounts of bright light in the form of laser radiation for various applications. Various optical, thermal, and mechanical characteristics of packages can present design obstacles, resulting in conventional designs having undesirable performance or features. Accordingly, a need remains for laser diode packages with fewer drawbacks.

SUMMARY

According to an aspect of the disclosed technology, apparatus include a laser diode package including a rigid thermally conductive base member that includes a base member surface situated to support at least one laser diode assembly, at least one electrode standoff secured to the base member surface that has at least one electrical lead having a first end and a second end with the first end secured to a lead surface of the electrode standoff, and a lid member that includes a lid portion and a plurality of side portions extending from the lid portion and situated to be secured to the base member so as to define sides of the laser diode package, wherein at least one of the side portions includes a lead aperture situated to receive the second end of the secured electrical lead that is insertable through the lead aperture so that the lid member extends over the base member to enclose the laser diode package. In some examples, at least one of the insulating electrode standoffs and at least one of the electrical leads correspond to a first electrode standoff and first electrical lead pair and a spaced apart second electrode standoff and electrical lead pair, wherein at least one of the side portions includes a side portion that includes a first lead aperture corresponding to the first electrical lead and a second lead aperture corresponding to the second electrical lead. In further examples, the laser diode package includes an electrically insulating grommet having a ring member defining an aperture situated to receive the second end of the at least one electrical lead, wherein the grommet is secured to the at least one side portion and the at least one electrical lead at the lead aperture. The laser diode package can further include an optical output terminal secured to the base member and that includes an optical fiber optically coupled to an interior region of the laser diode package so as to receive laser beams emitted from the at least one laser diode assembly. In some optical output terminal examples, at least one side portion including the lead aperture further includes an output terminal aperture having a shape that corresponds to a shape of the optical fiber output terminal. In additional optical output terminal examples, the base member includes a plurality of sub-members secured to the base member with each sub-member having a common footprint and defining at least a portion of the base member surface, and with each sub-member situated to receive at least one of the laser diode assemblies so as to provide a laser diode package output power scalability based on the quantity of sub-members, wherein at least one electrode standoff is secured to a first sub-member, and the other sub-members include at least one internal electrode standoff electrically coupled within the laser diode package to the electrical lead secured to the electrode standoff. In some examples, the plurality of sub-members includes a second sub-member with each at least one laser diode assembly of the respective first and second sub-members including a plurality of laser diodes situated to emit beams and to form a beam stack propagating in a common direction and having a slow axis of each beam parallel and spaced apart from each other and having a fast axis of each beam aligned with each other, wherein the common direction of the beams stacks are the same and the beam stacks are combined with a wavelength multiplexer or a polarization multiplexer secured to the first sub-member. In particular optical output terminal embodiments, one or more of the laser diode assemblies includes a plurality of laser diodes situated on separate steps of a mounting block to emit respective laser beams in a first common direction with each laser beam having a slow axis and a fast axis arranged so that the slow axes are parallel and spaced apart and the fast axes are parallel and spaced apart, wherein the one or more of the laser diode assemblies further includes a plurality of fast axis collimators respectively optically coupled to one of the laser beams to collimate the fast axis, a plurality of slow axis collimators respectively optically coupled to one of the fast axis collimated laser beams to collimate the slow axis, a plurality of turning mirrors respectively optically coupled to one of the fast axis and slow axis collimated laser beams to reflect the beam into a second common direction so that the slow axes are parallel and spaced apart and the fast axes are aligned to form a laser diode assembly beam stack, wherein the optical output terminal includes one or more focusing optics situated to optically couple the laser diode assembly beam stack into the optical fiber. In such particular optical output terminal examples, the one or more laser diode assemblies includes a first laser diode assembly and a second diode assembly with the first common direction of the second diode assembly being opposite to the first common direction of the first laser diode assembly. In some examples, the laser diode package further includes an optical output terminal situated to receive laser beams emitted from the at least one laser diode assembly and provide an output for free-space propagation of the laser beams outside of the laser diode package. According to some embodiments, the side portions of the lid member are flexibly secured to the base member at least in part with an epoxy. In other embodiments, the side portions are flexibly secured to the base member at least in part with one or more of an epoxy, a weld, solder, a press-fit, snap-fit, a braze, or a fastener. According to some flexibly secured examples, the side portions include a first pair of opposite side portions having a first length and a second pair of opposite side portions having a second length greater than the first length and extending perpendicularly to the first length so as to join the first pair at respective ends of the first and second lengths, wherein epoxy is situated between the base member and the second pair proximate a center portion of the second length and absent from the ends of the second length. In some embodiments, the lead aperture extends to an edge of the at least one side portion opposite the lid portion so as to define an open-ended lead aperture. Further examples include the lid member having a thickness that is selected in relation to the base member so as to reduce a warping of the base member associated with thermal cycling of the laser diode package. In some examples, the lid member and the base member comprise dissimilar metals with dissimilar coefficients of thermal expansion. According to some embodiments, the base member is made of copper or a copper alloy and the lid member is made of aluminum. According to further embodiments, the lid member is a deep drawn metal blank with the drawn sides corresponding to the plurality of side portions. In some embodiments, the lid member is a folded, cast, machined, or 3D printed lid member. In some laser diode packages, there is only one laser diode assembly with only one single-emitter laser diode.

According to another aspect of the disclosed technology, methods include securing at least one electrode standoff to a rigid thermally conductive baseplate member of a laser diode package and securing a first end of at least one electrical lead having the first end and a second to the at least one electrode standoff so that the electrical lead extend outside a footprint of the baseplate member with the second end situated outside the laser diode package, and enclosing the laser diode package with a lid member that includes a plurality of side portions that extend continuously from the a lid portion so as to define laser diode package sides and that includes at least one lead aperture in at least one of the side portions that corresponds to a cross-section of the at least one electrical lead extending outside the laser diode package, wherein the enclosing includes inserting the second end of the secured at least one electrical lead through the at least one lead aperture. In some examples, the electrode standoff and the electrical lead comprise a first electrical standoff and first electrical lead pair and a spaced apart second electrical standoff an electrical lead pair, and the one or more side portions includes a side portion that includes a first lead aperture corresponding to the first electrical lead and a second lead aperture corresponding to the second electrical lead. Some embodiments further include positioning an insulating grommet around the at least one electrical lead extending outside the laser diode package and securing the grommet to the at least one side portion and the at least one electrical lead at the lead aperture. Additional embodiments further include securing the side portions of the lid member to the baseplate member with epoxy. Some embodiments further include securing at least one laser diode assembly to the baseplate member.

The foregoing and other objects, features, and advantages of the disclosed technology will become more apparent from the following detailed description, which proceeds with reference to the accompanying figures.

BRIEF DESCRIPTION OF THE DRAWINGS

FIGS. 1A-1C show perspective views of a laser diode package embodiment.

DETAILED DESCRIPTION

Figure 1C:
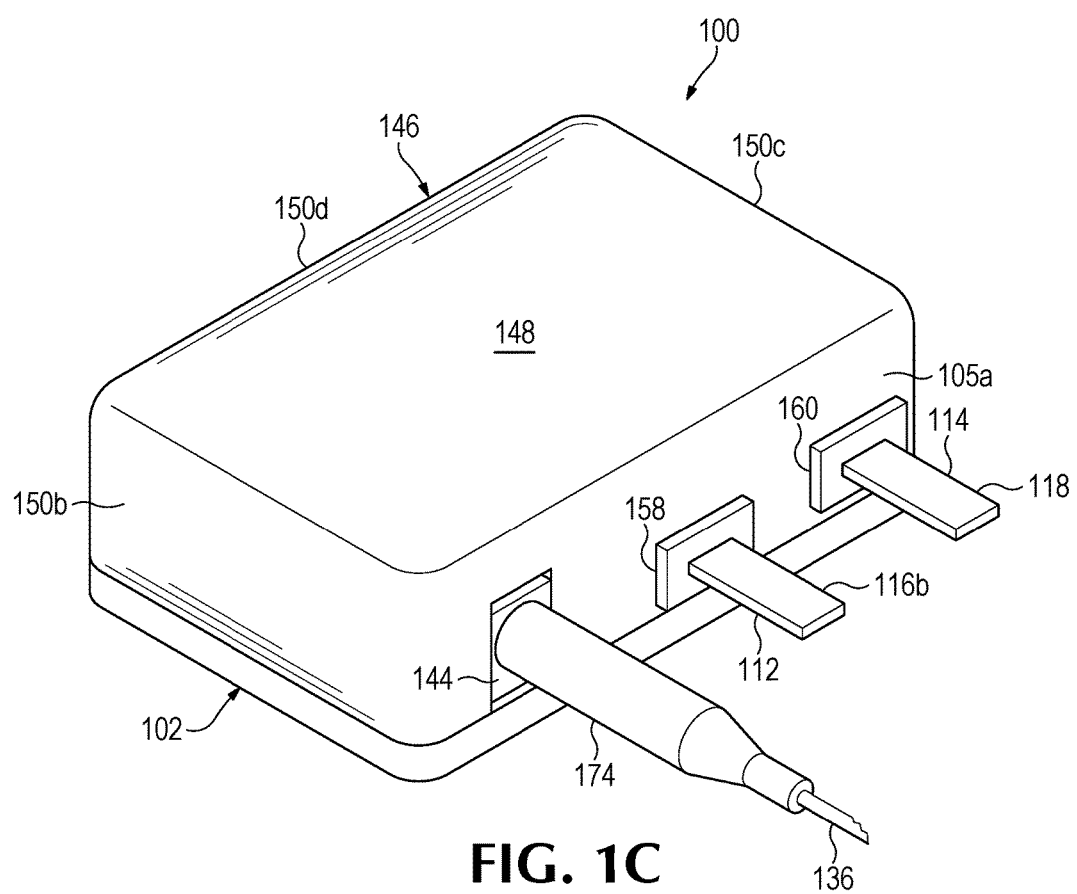

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest," "best," "minimum," or the like. It will be appreciated that such descriptions are intended to indicate that a selection among many used functional alternatives can be made, and such selections need not be better, smaller, or otherwise preferable to other selections.

As used herein, laser beams comprise optical radiation at wavelengths of between about 100 nm and 10 μm, and typically between about 500 nm and 2 μm. Examples based on available laser diode sources and optical fibers generally are associated with wavelengths of between about 800 nm and 1700 nm. In some examples, propagating optical radiation is referred to as one or more beams having diameters, asymmetric fast and slow axes, beam cross-sectional areas, and beam divergences that can depend on beam wavelength and the optical systems used for beam shaping. For convenience, optical radiation is referred to as light in some examples, and need not be at visible wavelengths.

Typical laser diodes have emission regions having non-circular cross-sections. An emission region of a laser diode can be associated with a slow axis that is directed along a longest dimension of the emission region and a fast axis that is directed along a shortest dimension of the emission region. Along the slow axis, an emitted beam tends to have a smaller angular divergence than the angular divergence along the fast axis. In addition, the slow axis tends to be associated with beam propagation in more transverse modes than beam propagation in the fast axis so that a beam parameter product (corresponding to a product of an angular divergence and a beam dimension) measured along the slow axis is larger than that measured along the fast axis. Beam divergences and diameters along the slow axis, the fast axis, or both can be adjusted with one or more lenses, prisms, or mirrors to provide selected beam characteristics.

Representative embodiments are described with reference to optical fibers, but other types of optical waveguides can be used having square, rectangular, polygonal, oval, elliptical or other cross-sections. Optical fibers are typically formed of silica (glass) that is doped (or undoped) so as to provide predetermined refractive indices or refractive index differences. In some, examples, fibers or other waveguides are made of other materials such as fluorozirconates, fluoroaluminates, fluoride or phosphate glasses, chalcogenide glasses, or crystalline materials such as sapphire, depending on wavelengths of interest. Refractive indices of silica and fluoride glasses are typically about 1.5, but refractive indices of other materials such as chalcogenides can be 3 or more. In still other examples, optical fibers can be formed in part of plastics. In typical examples, a doped waveguide core such as a fiber core provides optical gain in response to pumping, and core and claddings are approximately concentric. In other examples, one or more of the core and claddings are decentered, and in some examples, core and cladding orientation and/or displacement vary along a waveguide length.

As used herein, numerical aperture (NA) refers to a largest angle of incidence with respect to a propagation axis defined by an optical waveguide for which propagating optical radiation is substantially confined. In optical fibers, fiber cores and fiber claddings can have associated NAs, typically defined by refractive index differences between a core and cladding layer, or adjacent cladding layers, respectively. While optical radiation propagating at such NAs is generally well confined, associated electromagnetic fields such as evanescent fields typically extend into an adjacent cladding layer. In some examples, a core NA is associated with a core/inner cladding refractive index, and a cladding NA is associated with an inner cladding/outer cladding refractive index difference. For an optical fiber having a core refractive index $n_{core}$ and a cladding index $n_{clad}$, a fiber core NA is $NA=\sqrt{n_{core}^2-n_{clad}^2}$. For an optical fiber with an inner core and an outer core adjacent the inner core, a core NA is $NA=\sqrt{n_{inner}^2-n_{outer}^2}$, wherein $n_{inner}$ and $n_{outer}$ are refractive indices of the inner core and the outer core, respectively. Optical beams as discussed above can also be referred to as having a beam NA which is associated with a beam angular radius. While multi-core step index fibers are described below, gradient index designs can also be used.

In the examples disclosed herein, a waveguide core such as an optical fiber core is doped with a rare earth element such as Nd, Yb, Ho, Er, or other active dopants or combinations thereof. Such actively doped cores can provide optical gain in response to optical or other pumping. As disclosed below, waveguides having such active dopants can be used to form optical amplifiers, or, if provided with suitable optical feedback such as reflective layers, mirrors, Bragg gratings, or other feedback mechanisms, such waveguides can generate laser emissions. Optical pump radiation can be arranged to co-propagate and/or counter-propagate in the waveguide with respect to a propagation direction of an emitted laser beam or an amplified beam.

The term brightness is used herein to refer to optical beam power per unit area per solid angle. In some examples, optical beam power is provided with one or more laser diodes that produce beams whose solid angles are proportional to beam wavelength and inversely proportional to beam area. Selection of beam area and beam solid angle can produce pump beams that couple selected pump beam powers into one or more core or cladding layers of double, triple, or other single or multi-clad optical fibers. Beam cross-sectional areas, diameters, or other beam dimensions can be described using boundaries that generally correspond to a zero intensity value, a 1/e value, a $1/e^2$ value, a full-width half-maximum (FWHM) value, or other suitable metric.

Optical beams and optical elements are described in some examples with respect to one or more axes. Typically, an axis includes one or more straight line segments along which an optical beam propagates or along which one or more optical elements are situated. Such axes can be bent or folded with reflective surfaces, so that axes need not be single straight line segments. Various lenses are described or may be used, including convex-convex, planoconvex, concave-concave, planoconcave, cylindrical, fresnel, zone plates, holographic, spherical, aspheric, combinations thereof. In convenient examples, cylindrical lenses have cylindrical surfaces that are arranged perpendicular to each other to provide a cross-cylinder or crossed-cylinder lens or lens assembly. In typical examples, planoconvex cylindrical lenses have a plano surface and a cylindrically convex surface that define focal axes that can be parallel to or collinear with an axial center of curvature associated with the cylindrically convex surface. Beams are typically incident to such lenses parallel to an optical axis that is perpendicular to the plano surface. Such beams tend to focus along an axis (e.g., slow axis, fast axis) perpendicular to the focal axes and optical axis, and collimated beams tend to brought to a focus with respect to that axis at the focal axis. It will be appreciated that focal axes can be other than straight, depending on the characteristics of the lens. In some cross-cylinder examples, a first and second objective are spaced apart along an optical axis and provide a set of corresponding focal axes which are perpendicular to each other and intersect each other at a focal plane.

In various embodiments, optical components, such as lenses, mounts, housings, etc., are registered to other optical components. Surfaces of two or more optical components can be registered so as to align the corresponding optical components or to align other optical components or beams. Such registration and alignment can occur axially or transversely or in other ways suitable to provide corresponding alignment of optical components and beams. The term "surface" is used in connection with registering optical components, and it will be appreciated surfaces can include other features, including edges, planes, threads, serrations, textures, chamfers, notches, detents, clamping members, etc., and such surfaces can be arranged in orientations other than parallel or perpendicular to different features of optical components.

Laser diode package examples typically provide a housing to conduct heat out of the package (e.g., through a housing base), provide a protective enclosure from the external environment for the optics, lasers, and other components, and provide a mechanically stable platform for optical and substructure attachment that will maintain internal optical alignments throughout use, provide electrical feedthroughs of sufficient current handling and optical feedthroughs of sufficient size, and provide fastening locations for attaching (e.g., with screws or clamps) the housing to a rigid support that will thermally conduct heat away from the base of the laser package housing. Packages with a rigid wall consisting of Kovar or cold rolled steel, or copper walls, with a copper or copper/moly or copper/tungsten base, and copper or copper-cored leads within a ceramic or glass feedthrough, can provide the corresponding heat transfer. A separate lid is later attached via welding, solder, or epoxy, and the optical feedthrough port that is typically a part of the optical train is attached to a wall of the package, and not to the baseplate. Such configurations are susceptible to optic or fiber movement with the walls of the package, which are mechanically removed from the laser/optics typically attached to the base of the package. Additionally, during fabrication and brazing or firing of the electrical pins to the wall, the materials in the base, typically copper or alloy of copper, anneal during the firing process, causing the base to become soft and easily deformed. Holes used to screw down packages will often result in a slightly deformed base surface, causing a non-flat base on the package. Subsequent attachment of the package to other surfaces will result in a gap between the package and the mounting surface, reducing thermal transfer, increasing operating temperature of laser diodes within the package, and reducing reliability or varying laser wavelength outside of acceptable tolerances for particular applications.

To mitigate the aforementioned problems, very thick baseplates can be used along with harder but less thermally conductive materials (aluminum, copper/moly, or copper tungsten), or very thin mounting tabs that deform independent of the package, but provide little downward pressure across the package, especially in larger packages (greater than 1 cm sq). In typical examples, an entire interior surface of the laser diode package and electrical pins is gold plated to provide solderability for various diode package components, but the gold plating can be applied to some surfaces unnecessarily, such as side surfaces, thereby wasting gold material and increasing costs. As the package housings increase in size, the packages become prohibitively expensive and heavy, which increases cost, decreases suitability for various low-weight applications, and increases susceptibility to stress and handling damage. Multiple pins or large pins are needed for larger currents, but the connectors typically needed are relatively expensive.

A base can be selected that is made of a material with acceptably high thermal conductivity (often Cu or CuW), and mated to side-walls manufactured out of a less thermally conductive, but more dimensionally stable material (such as an alloy like Kovar, or a less expensive stainless steel alloy), with the mating performed via a relatively high temperature soldering or brazing process. The high temperature process significantly softens the material used in the baseplate. Additionally, the electrical connectors (usually Cu or Cu alloy conductor with a glass or ceramic insulator) are mounted through the wall of the package through a high temperature process which can further soften the baseplate material. A base can also be selected where the base and the walls are made from the same material (usually having a sufficiently high thermal conductivity which is balanced with the needs for dimensional stability), and the center of the package is machined away into a "bathtub-like" configuration leaving a monolithic structure. Although this process foregoes the high temperature brazing process to attach the walls, the electrical connectors and insulators are inserted into the side walls and secured with a high temperature brazing process, and therefore the package material is again softened. A large amount of machining with complex tolerances is required and a larger surface area which must be plated. A lid can be a stamped or machined flat "plate" which is attached via adhesive, mechanical clamping, welding or soldering.

In representative example of the disclosed technology herein, a laser diode package platform provides a rigid base that has a high thermal conductivity and high hardness throughout package fabrication and processing, resulting in a robust, lower cost laser diode package that would be otherwise achievable. A non-annealed copper (¼, half, ¾ or full hard) or copper alloy baseplate with machined features for optical mounting and flat base is plated for solderability (e.g., with gold). The package walls do not continuously extend from the base and are not otherwise attached nor is the lid, but instead a deep-drawn lid member that includes the package walls is installed after assembly of the internal components of the laser diode package is complete or nearly complete. This approach significantly reduces laser diode package cost and provides an open platform that addresses difficulties associated with manufacturing in a "box" design.

In some examples, instead of glass or ceramic feedthroughs attached to the package walls, electrical leads are attached via soldering to the base with a ceramic standoff or similar feature. In typical examples, the electrical leads are flat, but could be other shapes as well. The electrical leads provide an internal electrical surface for wirebonding or other contact to internal electrical traces, and separate stresses from the leads to the wires. The lid member is attached during the last stages of assembly, and brought over the electrical leads via openings in one or more walls of the shell. A gap between the lid member and the protruding electrical leads is filled with an insulator of ceramic, glass, high temperature plastic, or other non-electrically conductive material. In typical examples, the insulator provides light blockage and additional mechanical integrity to the lead/post assembly during customer handling. The lid member can then be screwed, epoxied, soldered, or welded to the baseplate.

In some examples, a thermal expansion and contraction of the lid and base is controlled through epoxy flexibility and/or mechanical slippage so as to inhibit deformation of the base or lid, yet maintain package and internal component integrity and alignment and to provide a seal against light leakage. In typical examples of the disclosed technology, package walls and a package lid are integrated into one part, and feedthroughs are mounted to the package independent of the lid and walls. Baseplate hardness can be retained throughout attachment of the ceramic post and electrical leads, which can be accomplished with soldering processes at a temperature below 350° C.

Herein, annealing generally refers to thermal processing, typically in metals, that increases grain size and softens the annealed material. Brazing generally refers to process involving a filler metal having a liquidus above 450° C. Soldering generally refers to processes involving filler metals with a liquidus at or below 450° C. Soldering usually results in a lower strength attachment as compared to brazing. Low temperature soldering generally refers to soldering processes where the solder is liquidus at temperatures at or below 200° C. High temperature soldering processes typically occur above 350° C.

In representative examples herein, the baseplate is fabricated (machined, molded, cast, or stamped) from a simple plate structure of sufficiently thermally conductive material (such as Cu or a Cu alloy). Because the baseplate does not undergo high temperature processing during package fabrication, the baseplate and package retain an original integrity, and experience substantially reduced surface warping (e.g., less than or equal to 50 μm, 30 μm, 10 μm, or 5 μm across a baseplate footprint), and therefore resulting in a more robust and reliable package product. Additionally, because the baseplate is simpler to manufacture (shorter machining time, fewer critical dimensions, no high temperature processes, and reduced surface area to plate), manufacturing costs are substantially reduced. The electrical connectors and standoffs are attached to the baseplate via a (relatively)

low temperature solder process, which can be similar to solder processes used to attach one or more other components to the baseplate.

To form the walls of the package, a lid member can be inexpensively stamped from an acceptable material (e.g., an aluminum alloy) to form an upside down bathtub like structure that is placed over the baseplate. The lid member can be attached in a manner where the differences in dimensional stability between the lid member and the baseplate without resulting in the application of stresses by the lid member to the baseplate that could compromise the function or reliability of the laser package. The lid member can be secured to the baseplate with an adhesive so as to limit or reduce the amount of heat and/or stress applied to the baseplate. In additional examples, other securing mechanisms can be used, such as fasteners (e.g., screws) or a low temperature soldering process. The cross-section of the electrically conductive pins can be varied in accordance with current requirements of the diode package, allowing high power/current operation without sacrificing reliability. Also, by removing the package sidewalls that are typically situated so that beams emitted by the laser diodes become blocked, the baseplate provides a platform for independent modular units of laser diode assemblies to be added so as to scale output power of the package. For example, by placing the modular units within close proximity to each other, the output of each modular unit can be combined into a single afocal or fiber coupled output by polarization, wavelength, or geometrically multiplexing the laser beams from the multiple modular units in the laser diode package.

In FIGS. 1A-1C, an example of a laser diode package 100 is shown that includes a base member 102 having a base member surface 103 on which a plurality of laser diode assemblies 104a-104d are secured to respective carrier plates 106a-106b. A pair of electrode standoffs 108, 110 are also secured to the base member 102 and a pair of corresponding electrodes 112, 114 are secured to the respective standoffs 108, 110 at electrode first ends 116a, 118a, with electrodes 112, 114 extending passed the footprint of the base member 102 so that the opposite electrode second ends 116b, 118b are situated outside of the laser diode package 100. The first ends 116a, 118a of the electrodes 112, 114 are situated proximate a plurality of laser diodes 120a-120d of the laser diode assemblies 104a-104d so that the laser diodes 120a-120d can be electrically coupled to the electrodes 112, 114 (e.g., through wire-bonding in a series relationship) to receive electrical current and to emit corresponding laser diode beams. The second ends 116b, 118b are coupled to an electrical source (not shown) to provide the current for the laser diodes 120a-120d. In representative examples, one or both of the standoffs 108, 110 are ceramic and electrically insulating. In some examples, all or a portion of at least one of the standoffs 108, 110 can be conductive. In some embodiments, an insulating material can be used to electrically insulate between the base member 102 and the standoffs 108, 110, or between the respective standoffs 108, 110 and the respective electrodes 112, 114. In particular examples, one of the electrodes 112, 114 can be electrically conductively coupled to the base member 102 through the respective standoff 108, 110.

The laser diode package 100 can be secured to other system components or housings with fasteners. For example, in fiber laser systems, a plurality of the laser diode packages 100 can be used as pump laser modules, and the pump laser modules can be secured to a fiber laser system housing.

The laser diode assemblies 104a-104d further include fast axis collimators 122a-122d and slow axis collimators 124a-124d that are situated to receive the laser diode beams emitted from the respective laser diodes 120a-120d and to collimate the beams along respective fast divergence axes 126 and slow divergence axes 128. The collimated beams are received by respective turning mirrors 130a-130d and turned so that the beams are stacked with the slow axes parallel to each other and the fast axes aligned to form a beam stack that is directed to focusing optics 132 that optically couple the beams into an endface 134 of an optical fiber 136. In typical examples, an objective lens 135 is situated to direct and focus one or axes of the beams at the endface 134 for coupling into the optical fiber 136. The endface 134 is situated in an optical output terminal 138 secured to the base member 102, e.g., with fasteners. An exterior portion 144 of the optical output terminal 138 is aligned with an edge of the base member 102. In typical examples, the laser diodes 120a-120d emit beams with maximum average optical powers in the range of 10 watts to 25 watts. The quantity of laser diode assemblies, laser diodes per assembly, and acceptance characteristics of the optical fiber 136 vary so that the total power of the combined beam stack coupled into the optical fiber 136 is in the range of 50 watts to 300 watts for different embodiments.

Laser beam wavelengths can vary based on diode materials, and are typically in the range of 700 nm to 1000 nm, though other wavelengths, including infrared and ultraviolet are also possible. Representative package embodiments have wavelengths selected for fiber laser pumping applications. In some examples, wavelengths are selected, narrowed, or locked with frequency selective elements, such as volume Bragg gratings that can be coupled to individual laser diodes or to groups of beams (e.g., beam stacks) and can be positioned in the beam path or paths in the laser diode package 100 where convenient to provide frequency locking performance, e.g., between slow axis collimators and turning mirrors, between fast axis collimators and slow axis collimators, between fast axis collimators and respective laser diodes, between turning mirrors and focusing optics, within focusing optics, etc. In particular examples, laser beam wavelengths center around 808 nm, 915 nm, or 976 nm, at a selected operating power and diode junction temperature. In some examples, laser diode assemblies can include one single-emitter laser diode, and some packages can include a single laser diode assembly (e.g., one assembly having a single laser diode, two laser diodes, three laser diodes, etc.). Some embodiments provide free-space coupling of the beam, beams, or combined beam stacks or stacks to the optical output terminal 138 without coupling the laser light into an optical fiber. In such examples, the focusing optics 132 can be omitted or modified so as to provide collimated free-space propagation of the beams outside of the laser diode package 100, e.g., to external beam shaping optics, targets, or other laser components situated to receive the beams.

Representative examples of the laser diode package 100 also include a lid member 146 that can be a singular, deep-drawn part having a lid portion 148 that defines a top of the laser diode package 100. In some examples, the lid portion has a plurality of side portions 150a-150d that can continuously extend from the lid portion 148 so as to define sides of the laser diode package 100. In further examples, the lid portion 148 can be folded, cast, machined, 3D printed, or formed in other ways. The side portion 150a, include openings 152, 154, 156, such as apertures, holes, slots, etc. In some examples, a single opening can be defined on a selected side portion and in other examples different opening can be defined on different selected side portions. The position of the openings 152, 154 in the side portion 150*a* respectively correspond to the electrical leads 112, 114 extending outside the laser diode package 100 when the lid member 146 is situated over the base member 102 to enclose the laser diode package 100. The position of the opening 156 corresponds to the exterior portion 144 of the optical output terminal 138 so that the optical output terminal 138 is enclosed with the lid member 146 situated over the base member 102. With the plurality of laser diode assemblies 104*a*-104*d*, electrode standoffs 108, 110 with secured electrical leads 112, 114, and optical output terminal 138 secured to the base member 102, the lid member 146 is inserted over the second ends 116*b*, 118*b* of the electrical leads 112, 114 at the openings 152, 154 and brought in position over the footprint of the base member 102 to enclose the laser diode package 100. In further examples, the lid member 146 can be omitted the electrode standoffs 108, 110 can be situated to support the electrical leads 112, 114 without support by the lid member 146. In different examples, the electrode standoffs 108, 110 include an increased cross-section or material strength, or are secured to the base member 102 with a higher strength solder, fastener, or other fastening mechanism, or the electrical leads 112, 114 are smaller, or a combination. For example, certain application may not require enclosure of the laser diode package 100 due to another enclosure or environment where laser light restriction is less important.

A pair of insulating grommets 158, 160 include respective grommet openings 162, 164 shaped to correspond with a cross-section of the electrical leads 112, 114. With the lid member 146 situated over the base member 102, the grommets 158, 160 are inserted over the electrical leads 112, 114 through the grommet openings 162, 164 and positioned at the openings 152, 154. The grommets 158, 160 include interior grommet portions 166, 168 that bridge at least a portion of a gap between the respective electrical leads 112, 114 and side portion 150*a* across the openings 152, 154. In some examples, outer surfaces 170, 172 of the interior grommet portions 166, 168 contact the side portion 150*a*. In further examples, an adhesive secures the outer surfaces 170, 172 to the side portion 150*a*. The grommets 158, 160 insulate the electrical leads 112, 114 conducting the current powering the laser diodes 120*a*-120*d* from the lid member 146, which can be made of various conductive or non-conductive material types, including copper and aluminum. Suitable insulating materials include high temperature ceramics, resins, and polymers. In some examples, the grommets 158, 160 are a fluid material that can be flowed around the electrical leads 112, 114 inserted through the openings 152, 154 and cured with the lid member 146 in position over base member 102 forming a tight insulating seal. The size difference between the openings 152, 154 and the cross-section of the electrical leads 112, 114 allows the lid member 146 to be positioned at an angle as the side portion 150*a* slides in relation to the electrical leads 112, 114 to enclose the base member 102 so as to provide clearance between the laser diode assemblies 104*a*-104*d* and the side portion 150*c*. The laser diode package 100 with the lid member 146 secured over the base member 102 and with grommets 158, 160 secured in place over the electrical leads 112, 114 is shown in FIG. 1C.

In typical examples, as the openings 152, 154 of the lid member 146 translate along the electrical leads 112, 114, the opening 156 can translate along a fiber termination 174. The opening 156 can be open ended so that the opening 156 extends to an edge of the side portion 150*a* allowing clearance for the optical fiber 136 and for the positioning of the lid member 146 over the base member 102 while the optical fiber 136 is coupled to the optical output terminal 138. The opening 156 can form a close, snug, or interference fit with the exterior portion 144 of the optical output terminal 138. An epoxy or other adhesive can be used to secure any gap between the exterior portion 144 and the side portion 150*a* at the opening 156. In representative examples, the lid member 146 is secured to the base member 102 with an adhesive, such as a high temperature epoxy, along at least a portion of the region of contact between edges of the side portions 150*a*-150*d* and the base member surface 103. In some examples, the adhesive is selectively applied to a middle region where the longer side portions 150*a*, 150*c* contact the base member surface 103. As the laser diode package 100 undergoes operational cycling, the selective application allows the base member 102 to be partly structurally uncoupled from the lid member 146 so that the base member 102 can expand or contract partly independently from the lid member 146. In further examples, the lid member 146 can be alternatively or additionally secured to the base member 102 through welding, soldering, press-fitting, snap-fitting, brazing, screw-type fastening or other fasteners, or a combination.

In representative examples, the thickness of the lid member 146 is smaller than the thickness of the base member 102 or reduced as compared to a conventional thickness difference between package side and base members. In some deep drawn lid member examples, the lid member 146 typically has a common thickness in the millimeter range, such as 0.05 mm, 0.1 mm, 0.5 mm, 1 mm, 2 mm, 5 mm, etc. The thickness of the base member 102 is typically measured from a bottom surface of the base member 102 to the surface of contact with the lid member 146 enclosing the laser diode package 100. Thicknesses also are typically in the millimeter range, such as 0.5 mm, 1 mm, 2 mm, 3 mm, 4 mm, 5 mm, or thicker. In examples where the thickness of the base member 102 is increased, the additional thickness enhances the rigidity and flexural strength of the base member 102 and corresponding resistance to deflection during construction of the laser diode package 100 and downstream implementation of the laser diode package 100 in larger systems or end-user applications. In general, the thickness difference also allows various other package variations, performance improvements, and cost reductions to be realized. For example, with the lid member 102 incorporating the package sides, typically with the lid portion 148 and side portions 150*a*-150*d* having a common thickness, a gold-plating can be applied to the base member 102 for component solderability without wasting application of the same material to the sides of the package.

As discussed above, in different embodiments, the lid member 146 can be made from aluminum, copper, or other materials. In some examples, the material of lid member 146 is different from the material of the base member 102. For example, the base member 102 can be made of copper and the lid member 146 can be made of aluminum. In some examples, the base member 102 and the lid member 146 can be different materials that have matched or non-matched coefficients of thermal expansion (CTE), including with metals, ceramics, or composites. CTE can be selected from available materials, including dissimilar materials, so as to reduce or minimize stress associated with a CTE mismatch. In some examples, the reduced thickness of the lid member 146 relative to the base member 102 allows the side portions 150*a*-150*d* to strain during fabrication, installation, or operation and reduce a deflection of the base member 102 associated with the strain. As shown, in representative embodiments of the laser diode package 100, the electrical leads 112, 114 are secured to electrode standoffs 108, 110. This provides an advantageous alternative to brazing electrode pins to the sides of laser diode packages, as the firing of the pins to the sides anneals or softens the sides and attached or continuously formed baseplate resulting in baseplate warping. In some examples, the material and/or thickness of the lid member 146 is selected so as to reduce a warping effect on the base member 102 associated with being secured to the base member 102. Additionally, by using the lid member 146, even with an increase in thickness of the base member 102, the overall weight of the laser diode package 100 is reduced as compared to a housing that incorporates the sides into the baseplate. Such overall weight reduction and improved thermal performance can be advantageous in devices used in aerospace applications where size, weight, and power (SWaP) concerns can be paramount. Also, weight and thermal improvements can allow package size increases, allowing for additional laser diode emitters, for example, or increased rigidity and/or strength improvements.

Figure 2:
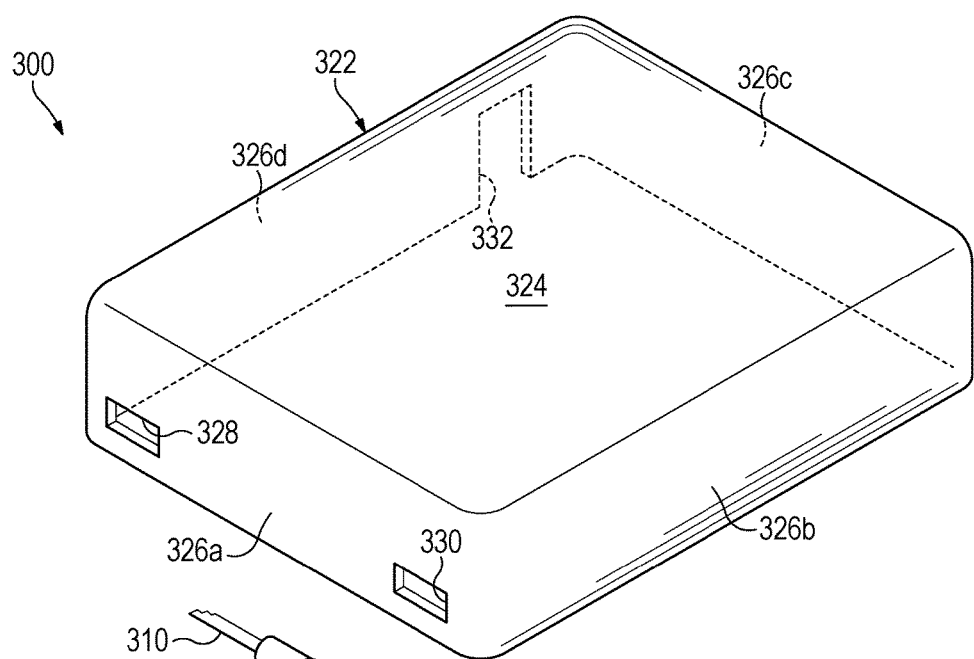
FIGS. 2-3 show perspective views of another laser diode package embodiment.
Figure 2:
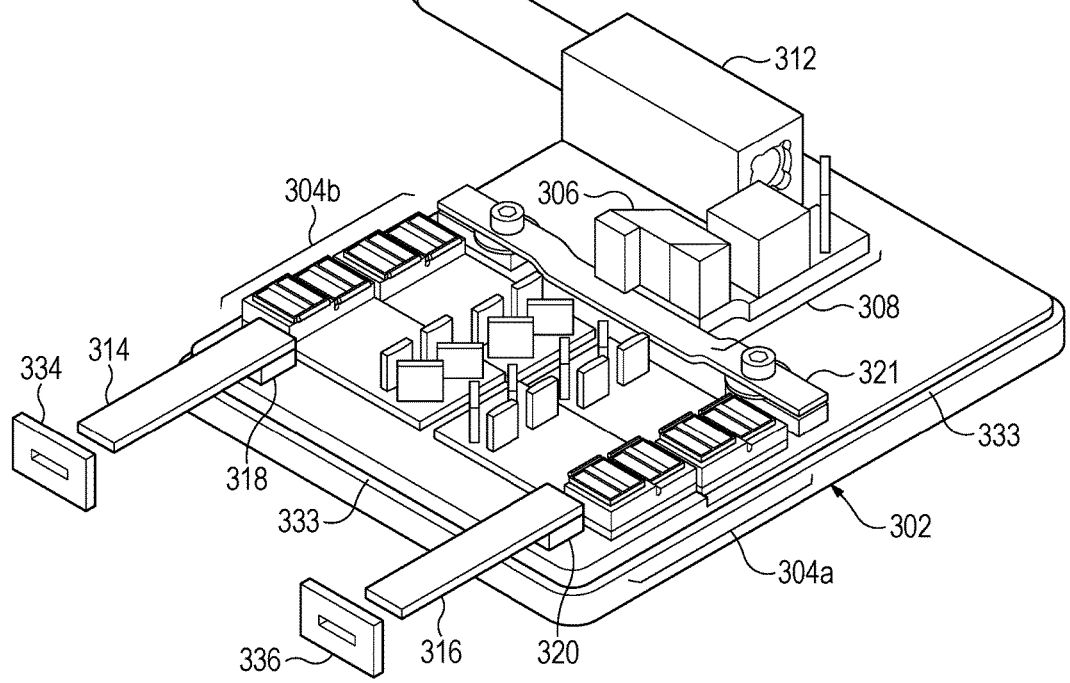
Figure 3:
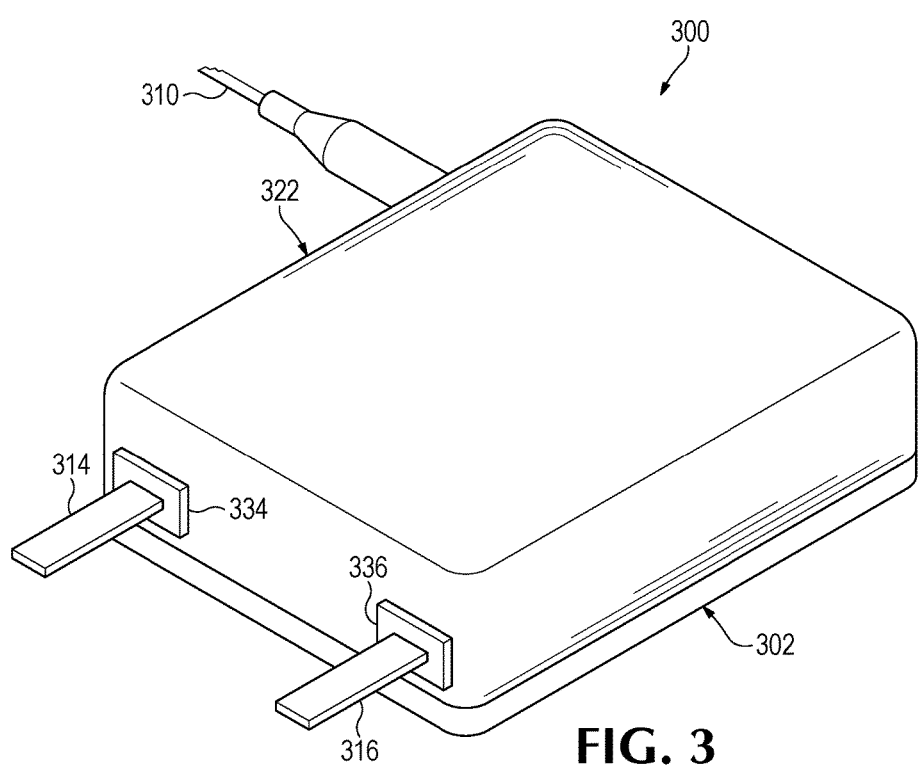

FIGS. 2-3 illustrate another example of a laser diode package 300 that includes a base member 302 and a pair of laser diode assemblies 304a, 304b each situated to emit a set of laser beams propagating along parallel propagation axes but in an opposite direction from the other. A pair of beam stacks are formed and received by a polarization multiplexer 306 that combines the beam stacks. Focusing optics 308 receive the combined beam stacks and couple the light into an optical fiber 310 coupled to an optical output terminal 312. A pair of electrical leads 314, 316 are secured to respective standoffs 318, 320 that are secured to the base member 302. An internal electrical bus bar 321 is secured to the base member 302 and provides an electrical path for completing a series circuit between the electrical lead 314 and the laser diode assembly 304a, and the laser diode assembly 304b and electrical 316.

A lid member 322 includes a lid portion 324 defining a top of the laser diode package 300 and a plurality of side portions 326a-326d defining sides of the laser diode package 300. The side portion 326a includes a pair of openings 328, 330 that are situated to receive the electrical leads 314, 316 so that the lid member 322 can be positioned over the base member 302 with the electrical leads 314, 316 secured to the standoffs 318, 320 and base member 302. The side portion 326d includes an opening 332 that extends to an edge of the side portion 326d so that as the lid member 302 is slidably engaging the electrical leads 314, 316, the lid member 302 can be lowered at the side portion 326c over the optical output terminal 312. The lid member 322 and base member 302 are secured together along at least a portion of a contact surface 333 so as to enclose the laser diode package 300. With the lid member 322 in position and contacting the base member 302, a pair of insulating grommets 334, 336 are inserted over the protruding electrical leads 314, 316 so as to surround the electrical leads 314, 316 in the openings 328, 330. The grommet 334, 336 are secured to the electrical leads 314, 316 and the side portion 326a.

Figure 4:
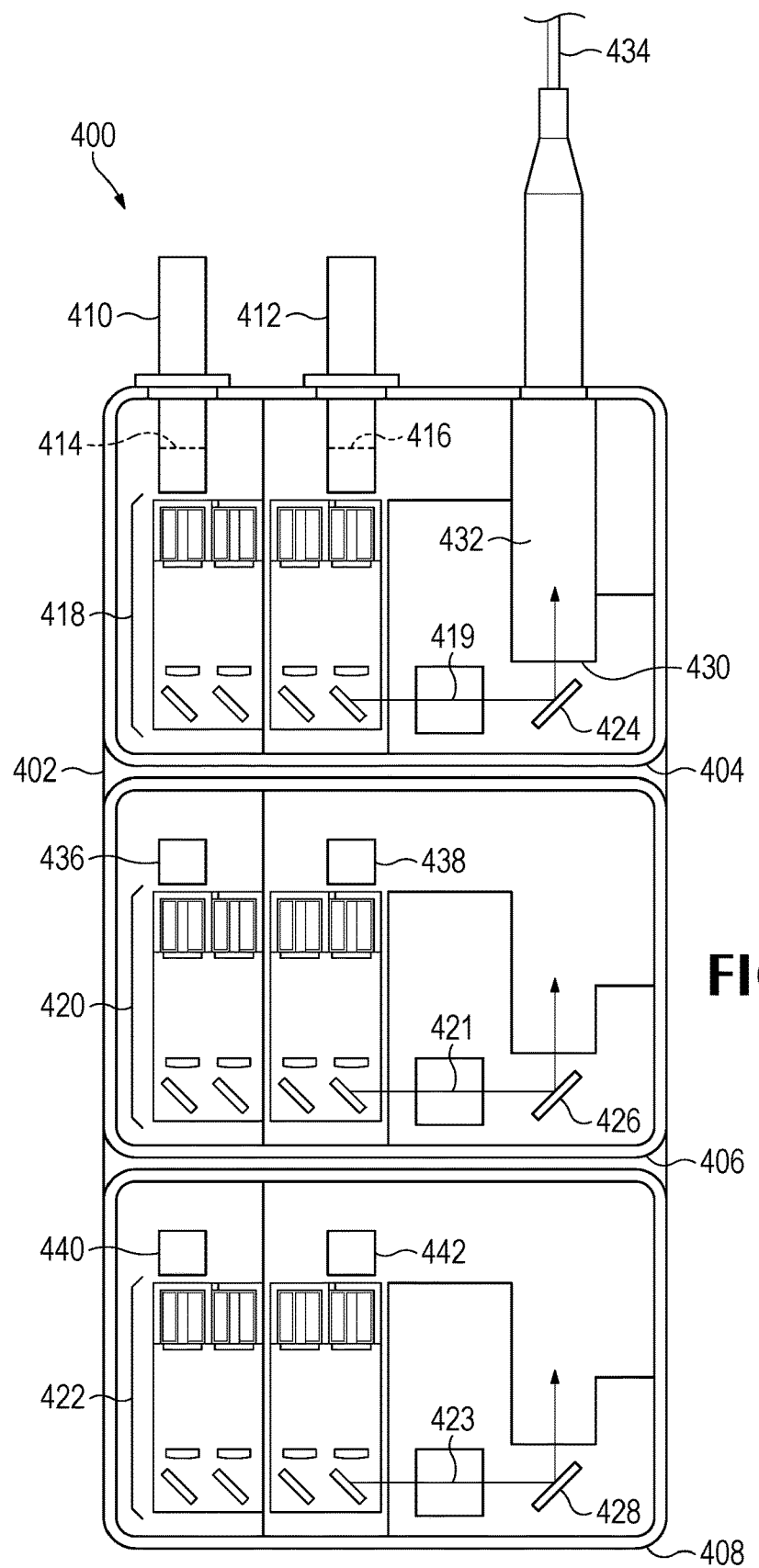
FIG. 4 shows a plan view of a modular laser diode package embodiment.

In FIG. 4, an example of a modular laser diode package 400 is shown that has a base member 402 that includes three sub-members 404, 406, 408 that can have several substantially similar features that streamline manufacturability of different product categories and scalability to different package output powers or other characteristics, such as numerical aperture. A pair of electrodes 410, 412 extend outside the laser diode package 400 from standoffs 414, 416 secured to the sub-member 404. Each of the three sub-members 404, 406, 408 includes respective laser diode assemblies 418, 420, 422 situated to emit respective sets of laser diode beams are directed into beam stacks 419, 421, 423. The beam stacks 419, 421, 423 are directed with turning mirrors 424, 426, 428 towards a focusing objective 430 situated in an optical output terminal 432 to become focused and coupled into an optical fiber 434. The beam stacks 419, 421, 423 can be combined in various ways. For example, one or more of the beam stacks 419, 421, 423 can be geometrically multiplexed so as to lie one above the other (i.e., in or out of the plane of FIG. 4) or side by side. One or more of the beam stacks 419, 421, 423 can be polarization multiplexed with the turning mirrors 424, 426. In representative examples, one or more of the beam stacks 419, 421, 423 are emitted at different wavelengths, and the turning mirrors 424, 426 include dichroic coatings so pass or reflect the corresponding incident beam stacks 419, 421, 423. In some examples, the sub-member 406 includes standoffs 436, 438 and the sub-member 408 includes standoffs 440, 442 that can be used to connect one or more internal conductive members to complete one or more circuits with the electrical leads 410, 412 and provide a current to the laser diode assemblies 418, 420, 422. In some examples, the electrical leads 410, 412 can be secured to other locations of the base member 402. For example, a pair or multiple pairs of electrodes can be coupled in from the left side of sub-members 404, 406, 408 in FIG. 4. The sub-members 404, 406, 408 are generally flat and without side members that would obstruct beam stack propagation so that laser diode packages of various sizes and configurations can be made and the footprint of the base member 402 can be modularly varied.

Figure 5:
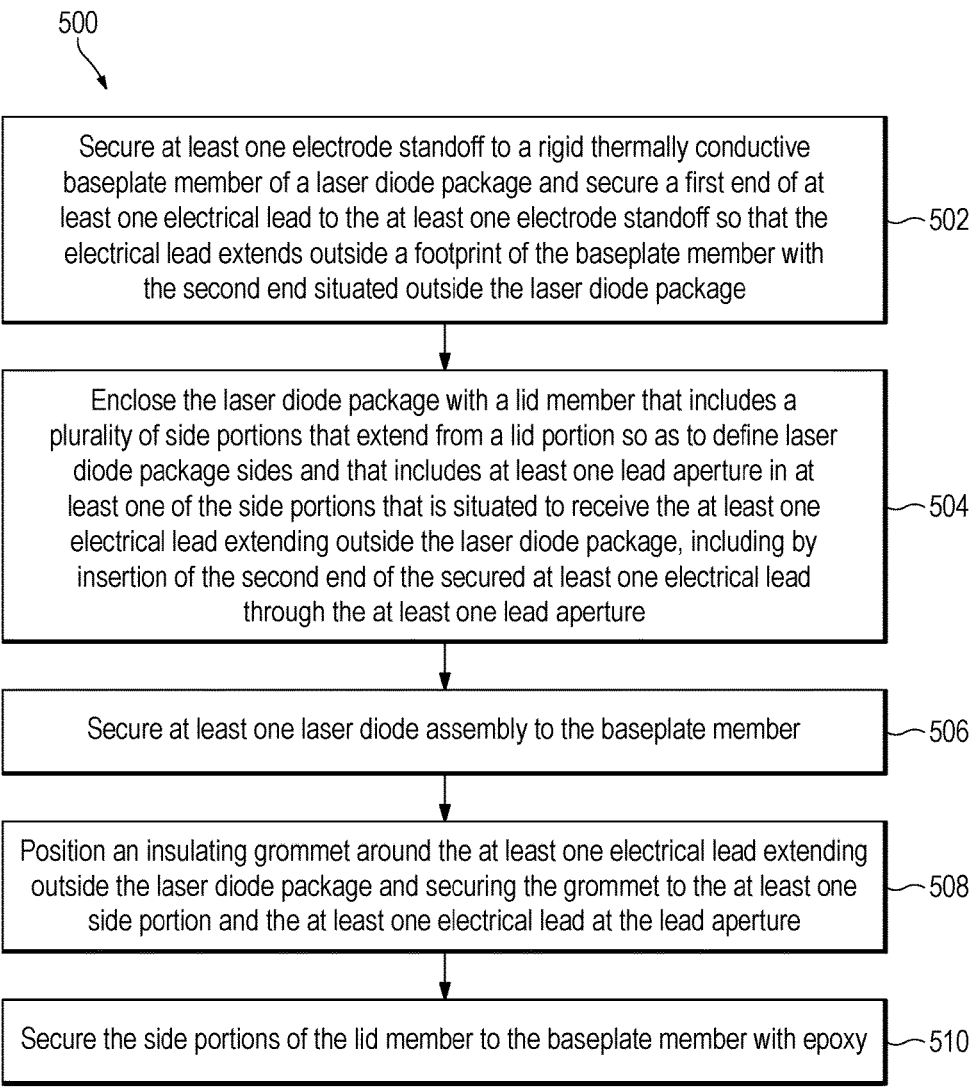
FIG. 5 is a flowchart of a representative method.

FIG. 5 shows an example of a method 500 of forming a laser diode package. At 502, at least one electrode standoff is secured to a rigid thermally conductive baseplate member of a laser diode package and a first end of at least one electrical lead is secured to the at least one electrode standoff so that the electrical lead extends outside a footprint of the baseplate member with the second end situated outside the laser diode package. At 504, the laser diode package is enclosed with a lid member that includes a plurality of side portions that extend from a lid portion so as to define laser diode package sides and that includes at least one lead aperture in at least one of the side portions that is situated to receive the at least one electrical lead extending outside the laser diode package. The enclosing typically includes inserting the second end of the secured at least one electrical lead through the at least one lead aperture. In representative examples, at 506, at least one laser diode assembly can be secured to the baseplate member. At 508, an insulating grommet can be positioned around the at least one electrical lead extending outside the laser diode package and the grommet can be secured to the at least one side portion and the at least one electrical lead at the lead aperture. In some examples, at 510, the side portions of the lid member can be secured to the baseplate member with epoxy, fasteners, or other securing mechanism.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of the appended claims.

We claim:

1. An apparatus, comprising:
a laser diode package including a rigid thermally conductive base member that includes a base member surface situated to support at least one laser diode assembly, at least one electrode standoff secured to the base member surface that has at least one electrical lead having a first end and a second end with the first end secured to a lead surface of the electrode standoff, and a lid member that includes a lid portion and a plurality of side portions extending from the lid portion and situated to be secured to the base member so as to define sides of the laser diode package;
wherein at least one of the side portions includes a lead aperture situated to receive the second end of the secured electrical lead that is insertable through the lead aperture so that the lid member extends over the base member to enclose the laser diode package.

2. The apparatus of claim 1, wherein the at least one electrode standoff and the at least one electrical lead comprise a first electrode standoff and first electrical lead pair and a spaced apart second electrode standoff and electrical lead pair;
wherein the at least one side portion includes a side portion that includes a first lead aperture corresponding to the first electrical lead and a second lead aperture corresponding to the second electrical lead.

3. The apparatus of claim 1, wherein the laser diode package includes an electrically insulating grommet having a ring member defining an aperture situated to receive the second end of the at least one electrical lead;
wherein the grommet is secured to the at least one side portion and the at least one electrical lead at the lead aperture.

4. The apparatus of claim 1, wherein the laser diode package further includes an optical output terminal secured to the base member and that includes an optical fiber optically coupled to an interior region of the laser diode package so as to receive laser beams emitted from the at least one laser diode assembly.

5. The apparatus of claim 4, wherein the at least one side portion including the lead aperture further includes an output terminal aperture having a shape that corresponds to a shape of the optical fiber output terminal.

6. The apparatus of claim 4, wherein the base member includes a plurality of sub-members secured to the base member with each sub-member having a common footprint and defining at least a portion of the base member surface, and with each sub-member situated to receive at least one of the laser diode assemblies so as to provide a laser diode package output power scalability based on the quantity of sub-members;
wherein the at least one electrode standoff is secured to a first sub-member, and the other sub-members include at least one internal electrode standoff electrically coupled within the laser diode package to the at least one electrical lead secured to the at least one electrode standoff.

7. The apparatus of claim 6, wherein the plurality of sub-members includes a second sub-member with at least one laser diode assembly of the respective first and second sub-members including a plurality of laser diodes situated to emit beams and to form a beam stack propagating in a common direction and having a slow axis of each beam parallel and spaced apart from each other and having a fast axis of each beam aligned with each other;
wherein the common direction of the beams stacks are the same and the beam stacks are combined with a wavelength multiplexer or a polarization multiplexer secured to the first sub-member.

8. The apparatus of claim 4, wherein one or more of the at least one laser diode assemblies includes a plurality of laser diodes situated on separate steps of a mounting block to emit respective laser beams in a first common direction with each laser beam having a slow axis and a fast axis arranged so that the slow axes are parallel and spaced apart and the fast axes are parallel and spaced apart;
wherein the one or more of the at least one laser diode assemblies further includes a plurality of fast axis collimators respectively optically coupled to one of the laser beams to collimate the fast axis, a plurality of slow axis collimators respectively optically coupled to one of the fast axis collimated laser beams to collimate the slow axis, a plurality of turning mirrors respectively optically coupled to one of the fast axis and slow axis collimated laser beams to reflect the beam into a second common direction so that the slow axes are parallel and spaced apart and the fast axes are aligned to form a laser diode assembly beam stack;
wherein the optical output terminal includes one or more focusing optics situated to optically couple the laser diode assembly beam stack into the optical fiber.

9. The apparatus of claim 8, wherein one or more of the at least one laser diode assemblies includes a first laser diode assembly and a second diode assembly with the first common direction of the second diode assembly being opposite to the first common direction of the first laser diode assembly.

10. The apparatus of claim 1, wherein the laser diode package further includes an optical output terminal situated to receive laser beams emitted from the at least one laser diode assembly and provide an output for free-space propagation of the laser beams outside of the laser diode package.

11. The apparatus of claim 1, wherein the side portions are flexibly secured to the base member at least in part with an epoxy.

12. The apparatus of claim 1, wherein the side portions are flexibly secured to the base member at least in part with one or more of an epoxy, a weld, solder, a press-fit, snap-fit, a braze, or a fastener.

13. The apparatus of claim 11, wherein the side portions include a first pair of opposite side portions having a first length and a second pair of opposite side portions having a second length greater than the first length and extending perpendicularly to the first length so as to join the first pair at respective ends of the first and second lengths;
wherein epoxy is situated between the base member and the second pair proximate a center portion of the second length and absent from the ends of the second length.

14. The apparatus of claim 1, wherein the lead aperture extends to an edge of the at least one side portion opposite the lid portion so as to define an open-ended lead aperture.

15. The apparatus of claim 1, wherein the lid member has a thickness that is selected in relation to the base member so as to reduce a warping of the base member associated with thermal cycling of the laser diode package.

16. The apparatus of claim 1, wherein the lid member and the base member comprise dissimilar metals with dissimilar coefficients of thermal expansion.

17. The apparatus of claim 1, wherein the base member is made of copper or a copper alloy and the lid member is made of aluminum.

18. The apparatus of claim 1, wherein the lid member is a deep drawn metal blank with the drawn sides corresponding to the plurality of side portions.

19. The apparatus of claim 1, wherein the lid member is a folded, cast, machined, or 3D printed lid member.

20. The apparatus of claim 1, wherein the laser diode assembly include a single, single-emitter laser diode.

21. A method, comprising:
  securing at least one electrode standoff to a rigid thermally conductive baseplate member of a laser diode package and securing a first end of at least one electrical lead to the at least one electrode standoff so that the electrical lead extends outside a footprint of the baseplate member with a second end situated outside the laser diode package; and
  enclosing the laser diode package with a lid member that includes a plurality of side portions that extend from a lid portion so as to define laser diode package sides and that includes at least one lead aperture in at least one of the side portions that is situated to receive the at least one electrical lead extending outside the laser diode package, wherein the enclosing includes inserting the second end of the secured at least one electrical lead through the at least one lead aperture.

22. The method of claim 21, wherein the at least one electrode standoff and the at least one electrical lead comprise a first electrical standoff and first electrical lead pair and a spaced apart second electrical standoff and second electrical lead pair;
  wherein the at least one side portion includes a first lead aperture situated to receive the first electrical lead and a second lead aperture situated to receive the second electrical lead.

23. The method of claim 21, further comprising positioning an insulating grommet around the at least one electrical lead extending outside the laser diode package and securing the grommet to the at least one side portion and the at least one electrical lead at the lead aperture.

24. The method of claim 21, further comprising securing the side portions of the lid member to the baseplate member with epoxy.

25. The method of claim 21, further comprising securing at least one laser diode assembly to the baseplate member.

* * * * *